United States Patent
Chou et al.

(10) Patent No.: US 8,796,105 B2
(45) Date of Patent: Aug. 5, 2014

(54) METHOD AND APPARATUS FOR PREPARING POLYSILAZANE ON A SEMICONDUCTOR WAFER

(75) Inventors: You-Hua Chou, Hsinchu (TW); Chih-Tsung Lee, Hsinchu (TW); Min-Hao Hong, Kaohsiung (TW); Ming-Huei Lien, New Taipei (TW); Chih-Jen Wu, Hsinchu (TW); Chen-Ming Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/558,284

(22) Filed: Jul. 25, 2012

(65) Prior Publication Data

US 2014/0030866 A1 Jan. 30, 2014

(51) Int. Cl.
*H01L 21/76* (2006.01)

(52) U.S. Cl.
USPC ............ 438/400; 438/786; 438/787; 118/58; 257/E21.266; 257/E21.546

(58) Field of Classification Search
None
See application file for complete search history.

(56) References Cited

U.S. PATENT DOCUMENTS

| | | | |
|---|---|---|---|
| 6,869,860 B2 * | 3/2005 | Belyansky et al. | 438/435 |
| 7,651,959 B2 * | 1/2010 | Fukazawa et al. | 438/786 |
| 7,781,352 B2 * | 8/2010 | Fukazawa et al. | 438/792 |
| 7,888,273 B1 * | 2/2011 | Wang et al. | 438/778 |
| 7,989,257 B2 | 8/2011 | Park et al. | |
| 8,058,139 B2 | 11/2011 | Sato et al. | |
| 8,530,330 B2 | 9/2013 | Ahn et al. | |
| 2011/0259089 A1 * | 10/2011 | Bouvier et al. | 73/61.52 |

FOREIGN PATENT DOCUMENTS

| | | |
|---|---|---|
| KR | 20090041945 A | 4/2009 |
| KR | 20090067812 A | 6/2009 |
| KR | 100914395 B1 | 8/2009 |
| KR | 20090091666 A | 8/2009 |

* cited by examiner

*Primary Examiner* — Charles Garber
*Assistant Examiner* — Syed Gheyas
(74) *Attorney, Agent, or Firm* — Slater and Matsil, L.L.P.

(57) ABSTRACT

A method for depositing a polysilazane on a semiconductor wafer is provided. The method includes steps of disposing a silazane onto the semiconductor wafer, and heating the silazane to form the polysilazane on the semiconductor wafer. An apparatus for preparing a polysilazane on a semiconductor wafer is also provided.

19 Claims, 6 Drawing Sheets

METHOD AND APPARATUS FOR PREPARING POLYSILAZANE ON A SEMICONDUCTOR WAFER

BACKGROUND

From the aspect of the design of integrated circuits, the technique of shallow trench isolation has several advantages in manufacturing processes and electrical isolation as compared with that of local oxidation of silicon (LOCOS), and accordingly becomes one of the main stream techniques after the era of line width narrower than 0.25 micron.

Generally, shallow trench isolations (STIs) are used to separate and isolate active areas on a semiconductor wafer from each other. These STIs have historically been formed by etching trenches, overfilling the trenches with a dielectric such as an oxide, and then removing any excess dielectric with a process such as chemical mechanical polishing (CMP) or etching in order to remove the dielectric outside the trenches. This dielectric helps to electrically isolate the active areas from each other.

Since the width of the trench in the STI is quite narrow, currently polysilazane is formed over the semiconductor wafer by the reaction of trisilylamine (a precursor), i.e. $N(SiH_3)_3$, oxygen, i.e. $O_2$, and ammonia gas, i.e. $NH_3$ under plasma treatment due to better flowability of polysilazane over oxide, and then the polysilazane is converted into oxide to provide the isolation.

However, the reaction of trisilylamine, oxygen and ammonia gas under the plasma treatment is quite violent, and accordingly the occurrence of defects, e.g. voids, in the polysilazane layer typically can not be avoided. These defects frequently result in the failure of isolation for line widths approaching nanometer scale. Hence, there is a need to solve the above problems.

DETAILED DESCRIPTION

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

Figure 1:
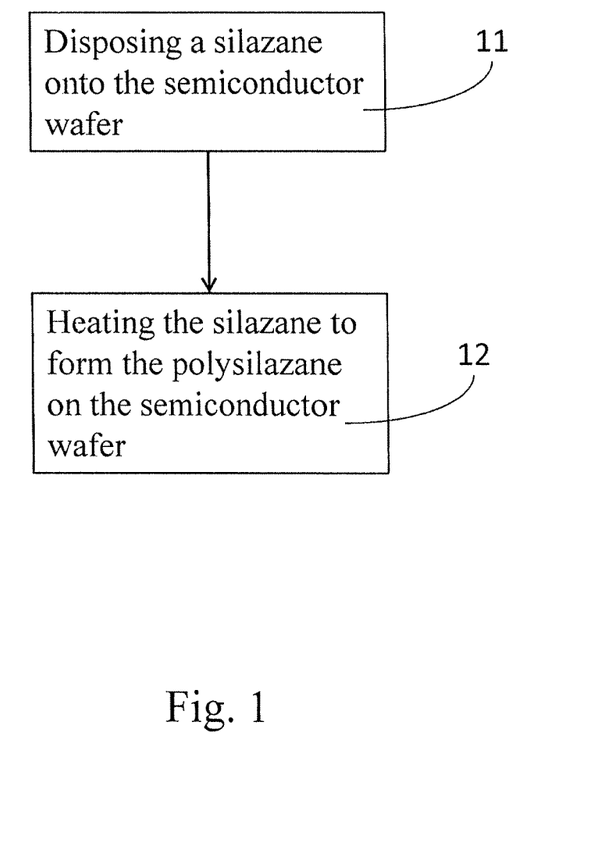
FIG. 1 is a flowchart showing a method for depositing a polysilazane on a semiconductor wafer in accordance with various embodiments of the present disclosure.

Please refer to FIG. 1, which is a flowchart showing a method for depositing a polysilazane on a semiconductor wafer in accordance with various embodiments of the present disclosure. The method includes the following steps. Firstly, a silazane is disposed onto the semiconductor wafer (step 11). Secondly, the silazane is heated to form the polysilazane on the semiconductor wafer (step 12). This semiconductor wafer can include a trench structure for forming a shallow trench isolation (STI) structure, and the trench structure is fully filled with the polysilazane. In some embodiments, the polysilazane formed on the semiconductor wafer is substantially free from any voids, and accordingly can solve the problem of serious defects caused by reacting trisilylamine (TSA) with $NH_3$ under the plasma treatment in the prior art. Therefore, the technique in some embodiments can be applied to the manufacture of STIs on integrated circuits with nano-scale line widths without any undesired voids or defects.

Optionally, the silazane in the step of disposing the silazane can be dissolved in a solvent, e.g. $NH_3$, to form a silazane solution to provide higher mobility than the silazane alone, and accordingly very narrow nano-scale trenches on the semiconductor wafer can still be fully filled with the silazane without any voids. The step 11 can be performed at a cooling temperature in a range from about −30 to 10° C. by using a silazane supplying device, e.g. a shower head with plural injecting holes, to inject the silazane solution onto the semiconductor wafer. In some embodiments, the cooling temperature is controlled to around −10 to 0° C. The controlled cooling temperature can prevent $NH_3$ from evaporating too rapidly, since its boiling point is around −34° C. at 1 atm. The silazane solution in the flow channels of the shower head can be kept under high pressure, which can increase the boiling point of $NH_3$ to allow $NH_3$ to stay in a liquid state as a good solvent for silazane at the temperature higher than the standard boiling point, −34° C.

The step 12 can optionally include sub-steps of heating the silazane solution at a drive-out temperature ranging from about 30 to 100° C. to drive out the solvent, venting the driven-out solvent, and annealing the silazane at an annealing temperature ranging from about 200 to 400° C. for an annealing time ranging from about 10 seconds to 1 hour to form the polysilazane on the semiconductor wafer. In some embodiments, the drive-out temperature can be controlled in a range of about 40 to 60° C., e.g. at 50° C., the annealing temperature can be controlled in a range of about 250 to 300° C., and the annealing time takes about 30 seconds to 10 minutes. The above-mentioned temperatures and time periods can be flexibly and appropriately adjusted for different wafer size, layer structures of integrated circuits, trench widths, trench depths, and/or concentration of silazane solution.

After the polysilazane is formed on the semiconductor wafer, there can be a further step of introducing a mixture of oxygen and water vapor to react with the polysilazane for converting the polysilazane into oxide, i.e. mainly $SiO_2$, at a converting temperature in a range of about 200 to 400° C. Since the trench structure on the semiconductor wafer is fully filled with polysilazane without any voids in the above embodiment, the oxide converted from the polysilazane stays in the trench structure without any voids as well. In some embodiments, the converting temperature is in a range of about 250 to 350° C.

Figure 2:
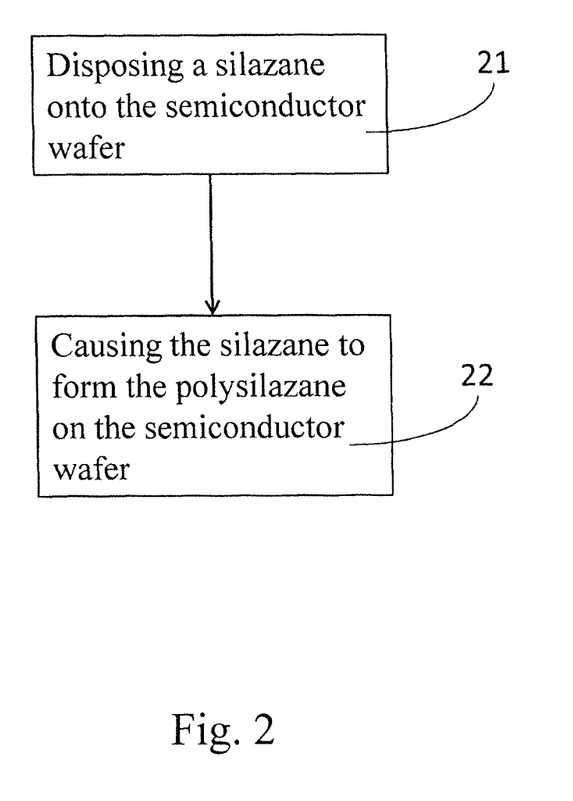
FIG. 2 is a flowchart showing a method for depositing a polysilazane on a semiconductor wafer in accordance with various embodiments of the present disclosure.

Please refer to FIG. 2, which is a flowchart showing a method for depositing a polysilazane on a semiconductor wafer according to various embodiments of the present disclosure. The method includes the following steps. Firstly, a silazane is disposed onto the semiconductor wafer (step 21). Secondly, the silazane is caused to form the polysilazane on the semiconductor wafer (step 22). The step 22 of causing the silazane to form the polysilazane on the semiconductor wafer can be performed by adopting the same technical approach, i.e. heating, in the above embodiment or other approaches, e.g. introducing a catalyst to facilitate the polymerization of silazane at lower temperature. Similarly, the technique in some embodiments can successfully produce the polysilazane layer without undesired voids in nano-scale trench structures or other tiny and complicated structures on the semiconductor wafer.

Figure 3:
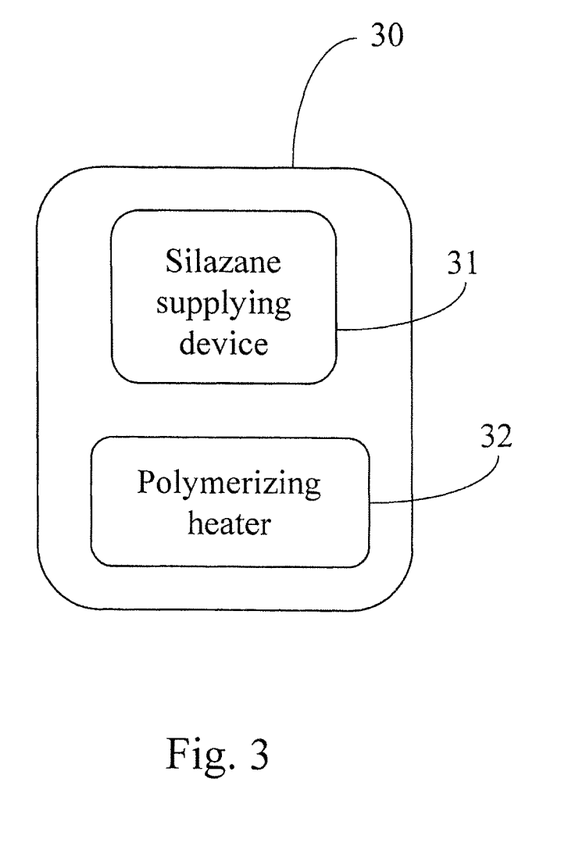
FIG. 3 is a schematic diagram showing an apparatus for preparing a polysilazane on a semiconductor wafer in accordance with various embodiments of the present disclosure.

Please refer to FIG. 3, which is a schematic diagram showing an apparatus 30 for preparing polysilazane on a semiconductor wafer according to various embodiments of the present disclosure. The apparatus 30 contains a silazane supplying device 31 and a polymerizing heater 32. The silazane supplying device 31 can supply silazane onto the semiconductor wafer, and the polymerizing heater 32 can heat the silazane to form the polysilazane on the semiconductor wafer.

In some embodiments, the silazane supplied by the silazane supplying device can be dissolved in a solvent, e.g. $NH_3$ at a cooling temperature in a range from about −30 to 10° C., to form a silazane solution to provide higher mobility than that of silazane alone, and accordingly the very narrow nano-scale trenches on the semiconductor wafer can still be fully filled with silazane without any voids.

In some embodiments, the silazane supply device can be designed to include a shower head with plural injecting holes for injecting the silazane solution onto the semiconductor wafer at a cooling temperature in a range of about −30 to 10° C. and under high pressure in a range of about 1 to 100 atm. In some embodiments, the cooling temperature is controlled to around −10 to 0° C. The controlled cooling temperature can prevent $NH_3$ from evaporating too quickly, since its boiling point is around −34° C. at 1 atm. The high pressure can increase the boiling point so that the $NH_3$ can still be kept in a liquid state as a good solvent for silazane at a temperature higher than the standard boiling point, −34° C.

Figure 4:
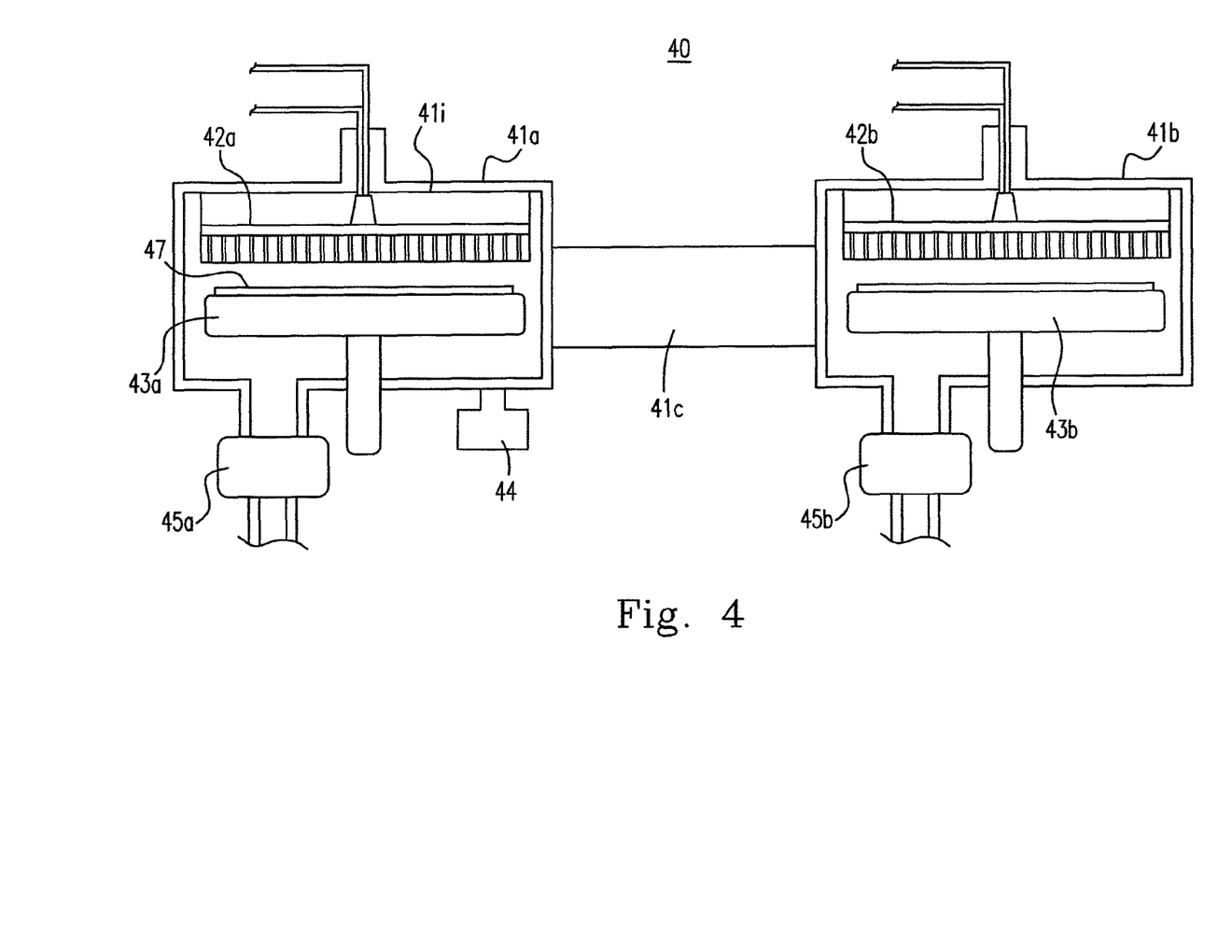
FIG. 4 is a schematic diagram showing an apparatus for preparing a polysilazane on a semiconductor wafer in accordance with various embodiments of the present disclosure.

Please refer to FIG. 4, which is a schematic diagram showing an apparatus 40 for preparing a polysilazane on a semiconductor wafer according to various embodiments of the present disclosure. The apparatus 40 contains a first chamber 41a, a passage 41c, a second chamber 41b, a silazane supplying device 42a, a reactant supplying device 42b, a polymerizing heater 43a, a converting heater 43b, a cooling device 44, a first pump 45a and a second pump 45b. In some embodiments, the silazane supply device 42a, e.g. a shower head with plural holes, and the polymerizing heater 43a are located inside the first chamber 41a.

In some embodiments, the silazane can be dissolved in appropriate solvent, e.g. $NH_3$, to form silazane solution for enhancing its mobility. The first pump 45a and the cooling device 44 are individually connected with the first chamber 41a, wherein the first pump 45a can be used to vacuum the first chamber 41a and to vent the solvent of the silazane solution, and the cooling device 44 can cool down the temperature of the inner wall 41i of the first chamber 41a so that the temperature inside the first chamber 41a can be appropriately controlled and cooled down to the desired temperature to the solvent, $NH_3$, from evaporating too rapidly. The semiconductor wafer 47 deposited with the polysilazane can be put on the polymerizing heater 43a, and accordingly the silazane after the evaporation of the solvent, $NH_3$, can be heated by the heat from the polymerizing heater 43a to undergo the polymerization to form the polysilazane layer on the semiconductor wafer 47. By adopting the method for preparing the polysilazane on the semiconductor wafer in the above embodiments and utilizing the apparatus 40 in some embodiments, the nano-scale trench structures, e.g. shallow trench isolation (STI) structures, on the semiconductor wafer 47 can be fully filled with polysilazane without undesired voids. Hence, the STI structures in nano-scale can be successfully produced with an extremely high yield rate.

The semiconductor wafer 47 is transferred from the first chamber 41a to the second chamber 41b through the passage 41c by using a mechanism, e.g. a robotic arm (not shown), after the polysilazane is formed on the semiconductor wafer 47. As shown in FIG. 4, a reactant supplying device 42b and a converting heater 43b are located inside the second chamber 41b, where the conversion reaction occurs by converting the polysilazane into oxide, i.e. mainly $SiO_2$. Generally, $SiO_2$ provides a better isolation function in the STI structures on the semiconductor wafer 47 than polysilazane.

In some embodiments, the reactant supplied by the reactant supplying device 42b includes oxygen and water vapor. In some embodiments, ozone is used as the reactant. The semiconductor wafer 47 transferred from the first chamber 41a is placed on the converting heater 43b, and the conversion reaction from polysilazane to oxide is facilitated by the heat provided by the converting heater 43b. In some embodiments, the conversion reaction occurs under a temperature controlled in a range of about 250 to 350° C. A second pump 45b is connected to the second chamber 41b for vacuuming the second chamber 41b and for venting the unreacted reactant and gaseous by-products.

It is noticeable that the above polymerizing heater 43a and the converting heater 43b can be the same, similar or different types of heaters, wherein the names of these heaters are given just for identification purposes, and the two heaters can be selected from various types of general or specific heaters independently.

Similarly, the above silazane supplying device 42a and the reactant supplying device 42b can be the same, similar or different types of devices, wherein the names of these devices are given just for identification purposes, and the size of the injecting holes of the silazane supplying device 42a can be designed to be usually different from or sometimes the same as that of the reactant supplying device 42b.

Figure 5A:
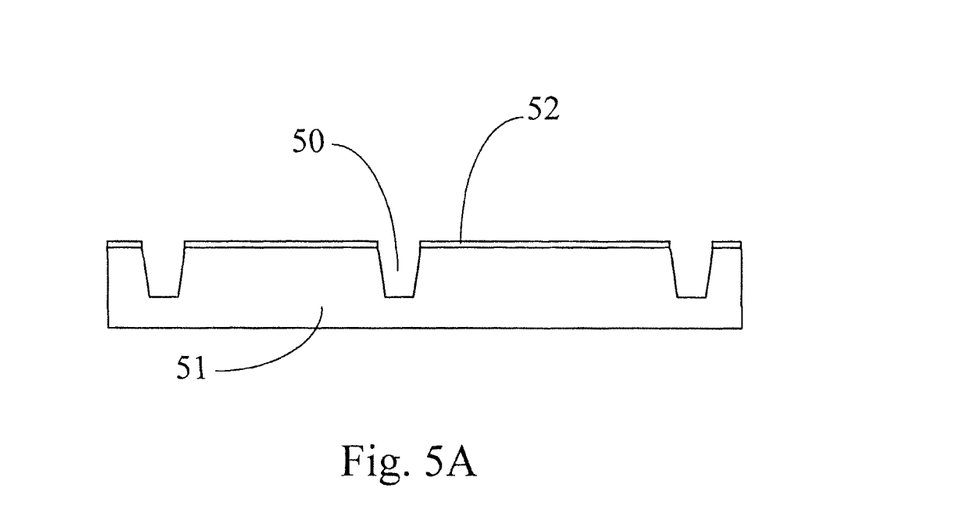
FIG. 5A is a schematic diagram showing an intermediate structure in a first process of forming a shallow trench insulation structure (STI) in accordance with various embodiments of the present disclosure.

In some embodiments, the intermediate structures in a first, a second, a third and a fourth processes of forming a shallow trench insulation structure (STI) on a semiconductor wafer according to various embodiments of the present disclosure are shown in FIGS. 5A-5D, respectively. As shown in FIG. 5A, trenches 50 are formed on the semiconductor wafer 51 by an etching process after a patterning process with a photoresist layer 52.

Figure 5B:
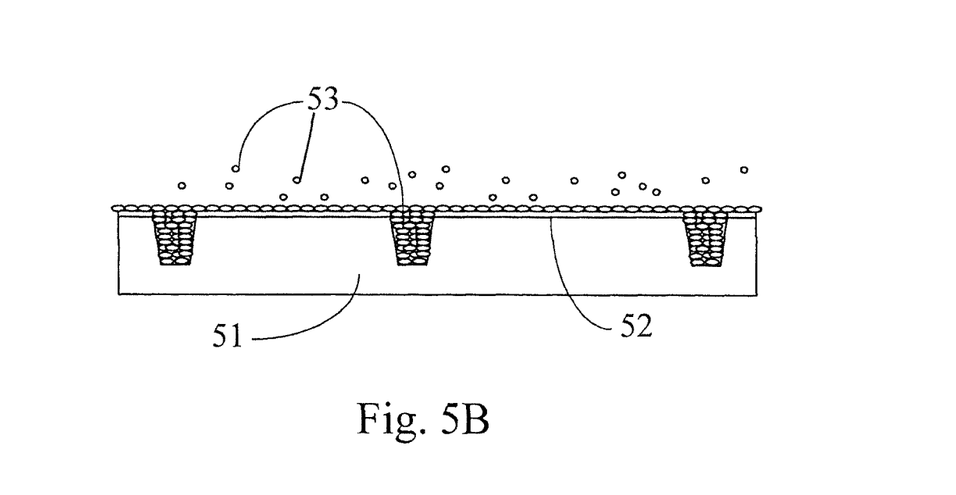
FIG. 5B is a schematic diagram showing an intermediate structure in a second process of forming the STI structure in accordance with various embodiments of the present disclosure.

Silazane monomers 53 (or a mixture of silazane monomers 53 and oligomers) dissolved in a solvent, e.g. $NH_3$, are disposed onto the semiconductor wafer 51 and fully fill the trenches 50, as shown in FIG. 5B.

Figure 5C:
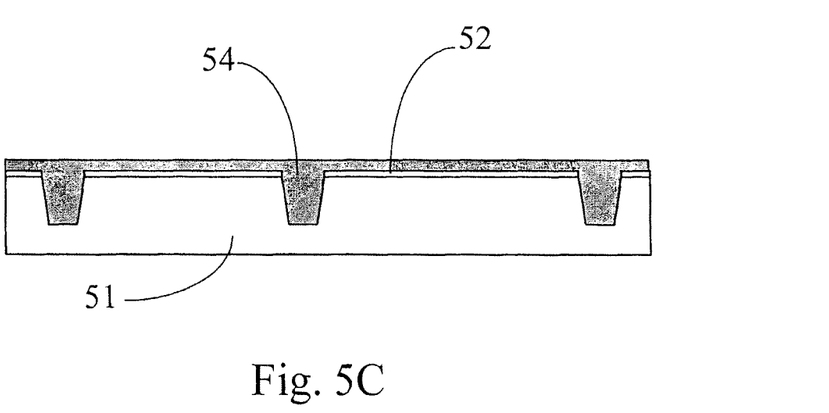
FIG. 5C is a schematic diagram showing an intermediate structure in a third process of forming the STI structure in accordance with various embodiments of the present disclosure.

The silazane monomers 53 (or a mixture of silazane monomers 53 and oligomers) are heated at drive-out temperature in a range of about 30 to 100° C., e.g. 40 to 60° C., to drive out the solvent, e.g. $NH_3$, which can be vented in a chamber by a pump. Then, the silazane monomers 53 (or a mixture of silazane monomers 53 and oligomers) are annealed at annealing temperature in a range of about 200 to 400° C., e.g. 250 to 300° C., for annealing time in a range of about 10 seconds to 1 hour, e.g. 0.5 to 10 minutes to form a polysilazane layer 54 with the polysilazane material, as shown in FIG. 5C. Since the mobility of the silazane monomers 53 or silazane oligomers is quite high, the trenches 50 in FIG. 5C can be fully filled with polysilazane after polymerization from silazane without any voids.

Figure 5D:
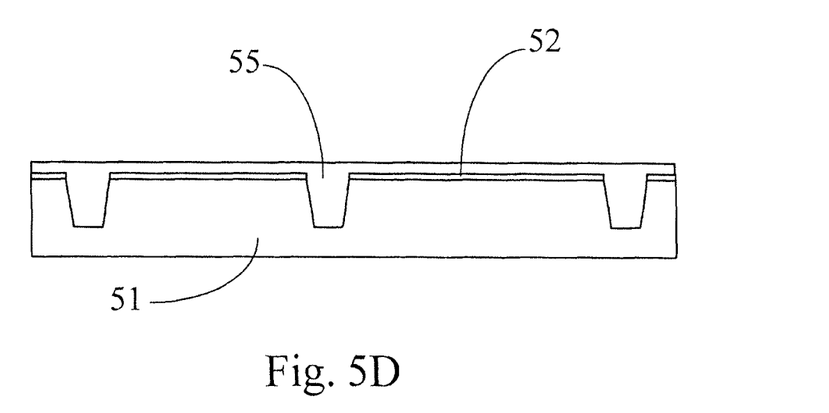
FIG. 5D is a schematic diagram showing an intermediate structure in a fourth process of forming the STI structure in accordance with various embodiments of the present disclosure.

Then, the reactants, oxygen and water vapor (steam), are introduced to be reacted with the polysilazane layer 54 for converting the polysilazane into oxide to form an oxide layer 55 at converting temperature in a range of about 200 to 400° C., e.g. 250 to 350° C. as shown in FIG. 5D. The trenches 50 are fully filled with oxide without any voids, since the oxide's precursor, polysilazane, fully fills the trenches 50 without any voids. Therefore, the structure shown in FIG. 5D can provide excellent insulation function with high reliability, which the conventional technique is unable to reach, especially for semiconductor chips with advanced nanometer scale line widths. In addition, the structure shown in FIG. 5D can be further treated by a chemical mechanical planarization (CMP) process or an etching process to remove the photoresist layer 52 and the part of oxide layer 55 in direct contact with the photoresist layer 52, for forming shallow trench insulation (STI) structures.

Embodiments

In accordance with one aspect of the present disclosure, a method for depositing a polysilazane on a semiconductor wafer is provided. The method includes steps of disposing a silazane onto the semiconductor wafer; and heating the silazane to form the polysilazane on the semiconductor wafer.

In accordance with another aspect of the present disclosure, an apparatus for preparing a polysilazane on a semiconductor wafer is provided. The apparatus includes a silazane supplying device for supplying a silazane onto the semiconductor wafer; and a polymerizing heater for heating the silazane to form the polysilazane on the semiconductor wafer.

In accordance with one more aspect of the present disclosure, a method for depositing a polysilazane on a semiconductor wafer is provided. The method includes steps of disposing a silazane onto the semiconductor wafer; and causing the silazane to form the polysilazane on the semiconductor wafer.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A method for depositing polysilazane on a semiconductor wafer, comprising steps of:
    disposing silazane onto the semiconductor wafer, wherein the semiconductor wafer includes a trench structure, and the disposing step comprises a substep of fully filling the trench structure with the silazane for forming a shallow trench isolation structure and wherein the silazane is in a silazane solution with a solvent prior to and at least partially during being disposed onto the semiconductor wafer; and
    heating the silazane to form the polysilazane on the semiconductor wafer.

2. The method of claim 1, wherein the disposing step is performed at a cooling temperature in a range of about −30 to 10° C., and includes a sub-step of using a shower head having plural injecting holes to inject therethrough the silazane solution onto the semiconductor wafer.

3. The method of claim 2, wherein the solvent includes $NH_3$, and the cooling temperature is in a range of about −10 to 0° C.

4. The method of claim 2, wherein the heating step includes sub-steps of:
    heating the silazane solution at a drive-out temperature in a range of about 30 to 100° C. to drive out the solvent;
    venting the driven-out solvent; and
    annealing the silazane at an annealing temperature in a range of about 200 to 400° C. for an annealing time in a range of about 10 seconds to 1 hour.

5. The method of claim 4, wherein:
    the drive-out temperature is in a range of about 40 to 60° C.;
    the annealing temperature is in a range of about 250 to 300° C.; and
    the annealing time is in a range of about 30 seconds to 10 minutes.

6. The method of claim 1, further comprising a step of introducing an oxygen and a water vapor to be reacted with the polysilazane for converting the polysilazane into an oxide at a converting temperature in a range of about 200 to 400° C.

7. The method of claim 6, wherein the converting temperature is in a range of about 250 to 350° C.

8. The method of claim 1, further comprising a step of introducing an ozone to be reacted with the polysilazane for converting the polysilazane into an oxide at a converting temperature in a range of about 200 to 400° C.

9. The method of claim 8, wherein the converting temperature is in a range of about 250 to 350° C.

10. An apparatus for preparing polysilazane on a semiconductor wafer, comprising:
    a silazane supplying device for dispensing silazane in a liquid silazane solution to fully fill trenches located within the semiconductor wafer; and
    a polymerizing heater for heating the silazane to form the polysilazane on the semiconductor wafer.

11. The apparatus of claim 10, wherein the trench structure is fully filled with the polysilazane.

12. The apparatus of claim 11, wherein the silazane supplying device comprises a shower head including plural injecting holes for injecting the silazane solution onto the semiconductor wafer, and the solvent includes $NH_3$.

13. The apparatus of claim 11, wherein:

the semiconductor wafer to be heated is disposed on the polymerizing heater;

the silazane solution is heated by the polymerizing heater at a drive-out temperature in a range of about 30 to 100° C. to drive out the solvent; and the silazane, after the solvent is driven out, is heated by the polymerizing heater at an annealing temperature in a range of about 200 to 400° C. for an annealing time in a range of about 10 seconds to 1 hour to form the polysilazane on the semiconductor wafer.

14. The apparatus of claim 13, wherein:

the drive-out temperature is in a range of about 40 to 60° C.;

the annealing temperature is in a range of about 250 to 300° C.; and the annealing time is in a range of about 30 seconds to 10 minutes.

15. The apparatus of claim 11, further comprising:

a first chamber including an inner wall, wherein the silazane supplying device and the polymerizing heater are disposed inside the first chamber; and a cooling device cooling the inner wall to provide a function of cooling the silazane solution at a cooling temperature ranged from −30 to 10° C.

16. The apparatus of claim 15, further comprising a first pump for vacuuming the first chamber and venting the solvent when the solvent is evaporated, wherein the cooling temperature is in a range of about −10 to 0° C.

17. The apparatus of claim 15, further comprising:

a passage;

a second chamber connected with the first chamber through the passage, wherein the semiconductor wafer having the polysilazane thereon is transported from the first chamber to the second chamber through the passage;

a reactant supplying device disposed inside the second chamber for supplying a reactant to be reacted with the polysilazane to form an oxide;

a second pump connected with the second chamber for vacuuming the second chamber; and a converting heater disposed inside the second chamber for heating the polysilazane at a converting temperature in a range of about 200 to 400° C. for converting the polysilazane into the oxide.

18. The apparatus of claim 17, wherein the reactant includes one of an ozone and a combination of an oxygen and a water vapor, the converting temperature is in a range of about 250 to 350° C., and the polysilazane heated by the converting heater at the converting temperature is reacted with the reactant and converted into an oxide.

19. A method for depositing a polysilazane on a semiconductor wafer, comprising steps of:

disposing a silazane solution into a deposition chamber to fully fill a trench located on the semiconductor wafer; and causing the silazane to form the polysilazane on the semiconductor wafer.

* * * * *